(12) United States Patent
Goldenshtein et al.

(10) Patent No.: US 10,168,614 B1
(45) Date of Patent: Jan. 1, 2019

(54) ON-AXIS ILLUMINATION AND ALIGNMENT FOR CHARGE CONTROL DURING CHARGED PARTICLE BEAM INSPECTION

(71) Applicants: APPLIED MATERIALS ISRAEL LTD., Rehovot (IL); ICT Integrated Circuit Testing Gesellschaft für Halbleiterprüftechnik mbH, Heimstetten (DE)

(72) Inventors: Alex Goldenshtein, Ness Ziona (IL); Stefan Lanio, Erding (DE)

(73) Assignees: APPLIED MATERIALS ISRAEL LTD., Rehovot (IL); ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 15/643,271

(22) Filed: Jul. 6, 2017

Related U.S. Application Data

(60) Provisional application No. 62/519,596, filed on Jun. 14, 2017.

(51) Int. Cl.
*H01J 37/28* (2006.01)
*H01J 37/22* (2006.01)
(Continued)

(52) U.S. Cl.
CPC .............. *G03F 1/86* (2013.01); *G03F 9/7073* (2013.01); *H01J 37/222* (2013.01);
(Continued)

(58) Field of Classification Search
CPC ........ G03F 9/7073; G03F 1/86; H01J 37/026; H01J 37/222; H01J 37/28; H01J 37/3007; H01J 37/3034
See application file for complete search history.

(56) References Cited

U.S. PATENT DOCUMENTS 4,789,786 A    12/1988  Yasuda et al.
6,476,387 B1   11/2002  Nishimura et al.
(Continued)

OTHER PUBLICATIONS

U.S. Appl. No. 15/595,214 Non-Final Office Action dated Jan. 19, 2018, 9 pages.
(Continued)

*Primary Examiner* — Eliza Osenbaugh-Stewart
(74) *Attorney, Agent, or Firm* — Kilpatrick Townsend & Stockton LLP

(57) ABSTRACT

A charged particle beam apparatus includes a charged particle source configured to generate charged particles, an electrode configured to accelerate the charged particles to form a charged particle beam, a bender unit configured to adjust a path of the charged particle beam, and an objective lens configured to focus the charged particle beam onto a spot on a sample. The charged particle beam passes through a bore of the objective lens as the charged particle beam propagates from the charged particle source to the sample. The apparatus also includes a light source configured to generate a light beam, and a mirror disposed within the bender unit and arranged to direct the light beam to the spot on the sample.

18 Claims, 7 Drawing Sheets

(51) Int. Cl.
  *G03F 1/86* (2012.01)
  *H01J 37/304* (2006.01)
  *G03F 9/00* (2006.01)
  *H01J 37/30* (2006.01)
  *H01J 37/317* (2006.01)

(52) U.S. Cl.
  CPC ...... *H01J 37/3007* (2013.01); *H01J 37/3045* (2013.01); *H01J 37/3174* (2013.01); *H01J 2237/063* (2013.01); *H01J 2237/30433* (2013.01)

(56) References Cited

U.S. PATENT DOCUMENTS

| | | | |
|---|---|---|---|
| 8,692,214 B2 | 4/2014 | Zhao et al. | |
| 9,040,909 B2 | 5/2015 | Parker | |
| 9,673,023 B2 | 6/2017 | Goldenshtein | |
| 2006/0289755 A1 | 12/2006 | Koyama et al. | |
| 2007/0023655 A1 | 2/2007 | Nishikata et al. | |
| 2008/0315093 A1* | 12/2008 | Hasegawa | G01N 23/225 250/310 |
| 2009/0242800 A1 | 10/2009 | Kuribara et al. | |
| 2010/0044566 A1* | 2/2010 | Donitz | B08B 7/0035 250/311 |
| 2010/0108882 A1 | 5/2010 | Zewail et al. | |
| 2010/0108883 A1 | 5/2010 | Zewail | |
| 2011/0068267 A1 | 3/2011 | Hasegawa et al. | |
| 2011/0204228 A1* | 8/2011 | Tsuno | H01J 37/224 250/310 |
| 2011/0248164 A1 | 10/2011 | Straw et al. | |
| 2014/0014848 A1 | 1/2014 | Hatakeyama et al. | |
| 2015/0340193 A1 | 11/2015 | Hatakeyama et al. | |
| 2016/0211112 A1 | 7/2016 | Nakao et al. | |
| 2016/0336146 A1 | 11/2016 | Goldenshtein | |
| 2016/0343534 A1 | 11/2016 | Wang et al. | |
| 2017/0250052 A1 | 8/2017 | Goldenshtein | |

OTHER PUBLICATIONS

U.S. Appl. No. 14/710,297, "Non-Final Office Action", dated Jun. 28, 2016, 15 pages.
U.S. Appl. No. 14/710,297, "Notice of Allowance", dated Feb. 3, 2017, 10 pages.
U.S. Appl. No. 15/595,214 Notice of Allowance dated Jul. 31, 2018, 11 pages.

* cited by examiner

ON-AXIS ILLUMINATION AND ALIGNMENT FOR CHARGE CONTROL DURING CHARGED PARTICLE BEAM INSPECTION

CROSS REFERENCE TO RELATED APPLICATIONS

This application claims the benefit of U.S. Provisional Application No. 62/519,596, filed Jun. 14, 2017, the entire contents of which are incorporated herein by reference in their entirety for all purposes.

BACKGROUND

Charged particle beam inspection tools scan areas of a sample with a charged particle beam. An example is an electron beam inspection (EBI) tool that scans areas of a sample with an electron beam.

Scanning with a charged particle beam causes the sample to emit charged particles such as secondary and backscattered electrons. The charged particle beam inspection tool may detect some of the emitted charged particles to generate an image of the scanned area.

Scanning also charges the sample (or the scanned area). Charging can distort an image of the scanned area or distort images of areas that are electrically coupled to the scanned area.

Thus, there is a growing need to prevent or reduce charging during inspection processes and/or to activate or turn on devices such as diodes within the sample that can facilitate charge dissipation.

SUMMARY

In light of the above, apparatuses and methods for charged particle beam inspection are provided that can reduce or eliminate sample charging. In an embodiment, for example, a method of scanning a spot on a sample includes directing a charged particle beam and a light beam to the spot on the sample. The light beam and the charged particle beam can be aligned on the spot, and the light beam can be arranged to impinge on the sample at a substantially normal incidence. This can improve light absorption and charge dissipation allowing charge control during inspection.

In accordance with an embodiment, a charged particle beam apparatus includes a charged particle source configured to generate charged particles, an electrode configured to accelerate the charged particles to form a charged particle beam, a bender unit configured to adjust a path of the charged particle beam, and an objective lens configured to focus the charged particle beam onto a spot on a sample. The charged particle beam passes through a bore of the objective lens as the charged particle beam propagates from the charged particle source to the sample. The apparatus also includes a light source configured to generate a light beam and a mirror disposed within the bender unit and arranged to direct the light beam to the spot on the sample.

In an embodiment, the mirror is arranged to direct the light beam through the bore of the objective lens and to the spot on the sample.

In accordance with another embodiment, a method of scanning a sample includes generating charged particles using a charged particle source, accelerating the charged particles using an electrode to form a charged particle beam, adjusting a path of the charged particle beam using a bender unit, and focusing the charged particle beam onto a spot on the sample using an objective lens. The charged particle beam passes through a bore of the objective lens as the charged particle beam propagates from the charged particle source to the sample. The method also includes generating a light beam using a light source and directing the light beam through the bore of the objective lens using a mirror disposed within the bender unit. The light beam is directed to the spot on the sample.

In accordance with yet another embodiment, a method of aligning a charged particle beam of a charged particle apparatus with a light beam includes generating charged particles using a charged particle source, accelerating the charged particles using an electrode to form the charged particle beam, adjusting a path of the charged particle beam using a bender unit, and focusing the charged particle beam onto a sample support using an objective lens. The charged particle beam passing through a bore of the objective lens as the charged particle beam propagates from the charged particle source to the sample support. The charged particle beam is scanned across a surface of the sample support, and charged particles emitted or reflected from the sample support during scanning are detected to identify a pinhole in the sample support. The path of the charged particle beam is adjusted to be substantially aligned with the pinhole. The method also includes generating the light beam using a light source and directing the light beam toward the surface of the sample using a mirror disposed within the bender unit. The light beam is detected using a light sensor when the light beam is aligned with the pinhole. A path of the light beam is adjusted to be substantially aligned with the pinhole.

Embodiments are also directed to apparatuses for carrying out the disclosed methods and include apparatus parts for performing each described method feature. The method features may be performed by way of hardware components, a computer programmed by appropriate software, by any combination of the two, or in any other manner. Furthermore, embodiments are also directed to methods of operating the described apparatuses and include method features for carrying out every function of the apparatuses.

Further aspects, advantages, and features will be apparent from the claims, description, and accompanying drawings.

BRIEF DESCRIPTION OF THE DRAWINGS

The various embodiments described herein, both as to organization and method of operation, together with features and advantages thereof, can best be understood by reference to the following detailed description and accompanying drawings, in which.

It will be appreciated that for simplicity and clarity of illustration, elements shown in the figures have not necessarily been drawn to scale. For example, the dimensions of some of the elements may be exaggerated relative to other elements for clarity. Further, where considered appropriate,

DETAILED DESCRIPTION

In the following detailed description, numerous specific details are set forth in order to provide a thorough understanding of the embodiments described herein. However, it should be understood that the various embodiments can be practiced without these specific details. In other instances, well-known methods, procedures, and components have not been described in detail so as not to obscure the described features.

Reference will be made in detail to the various embodiments, one or more examples of which are illustrated in the figures. Each example is provided by way of explanation and is not meant as a limitation. Further, features illustrated or described as part of one embodiment can be used on or in conjunction with other embodiments to yield yet a further embodiment. The description is intended to include these modifications and variations.

A "specimen" or "sample" as referred to herein includes, but is not limited to, semiconductor wafers, semiconductor workpieces, photolithographic masks, and other workpieces such as memory disks and the like. According to some embodiments, which can be combined with other embodiments described herein, the apparatus and methods are configured for or are applied for inspection, for critical dimensioning applications, and defect review applications.

Any reference in the specification to a method should be applied mutatis mutandis to a system capable of executing the method.

Any reference in the specification to a system should be applied mutatis mutandis to a method that can be executed by the system.

Embodiments described herein relate generally to apparatuses and methods for reducing charging during charged particle beam inspections. Some embodiments may also be used to activate or turn on devices within a sample such as diodes. In accordance with an embodiment, for example, a charged particle beam and a light beam can be aligned to a spot on a sample. The light beam may be directed to the spot by a mirror arranged in a bender unit that is configured to adjust a path of the charged particle beam. The light beam may be directed from the mirror through a bore of an objective lens. The light beam can be arranged to impinge on the spot at a substantially normal incidence.

Figure 1:
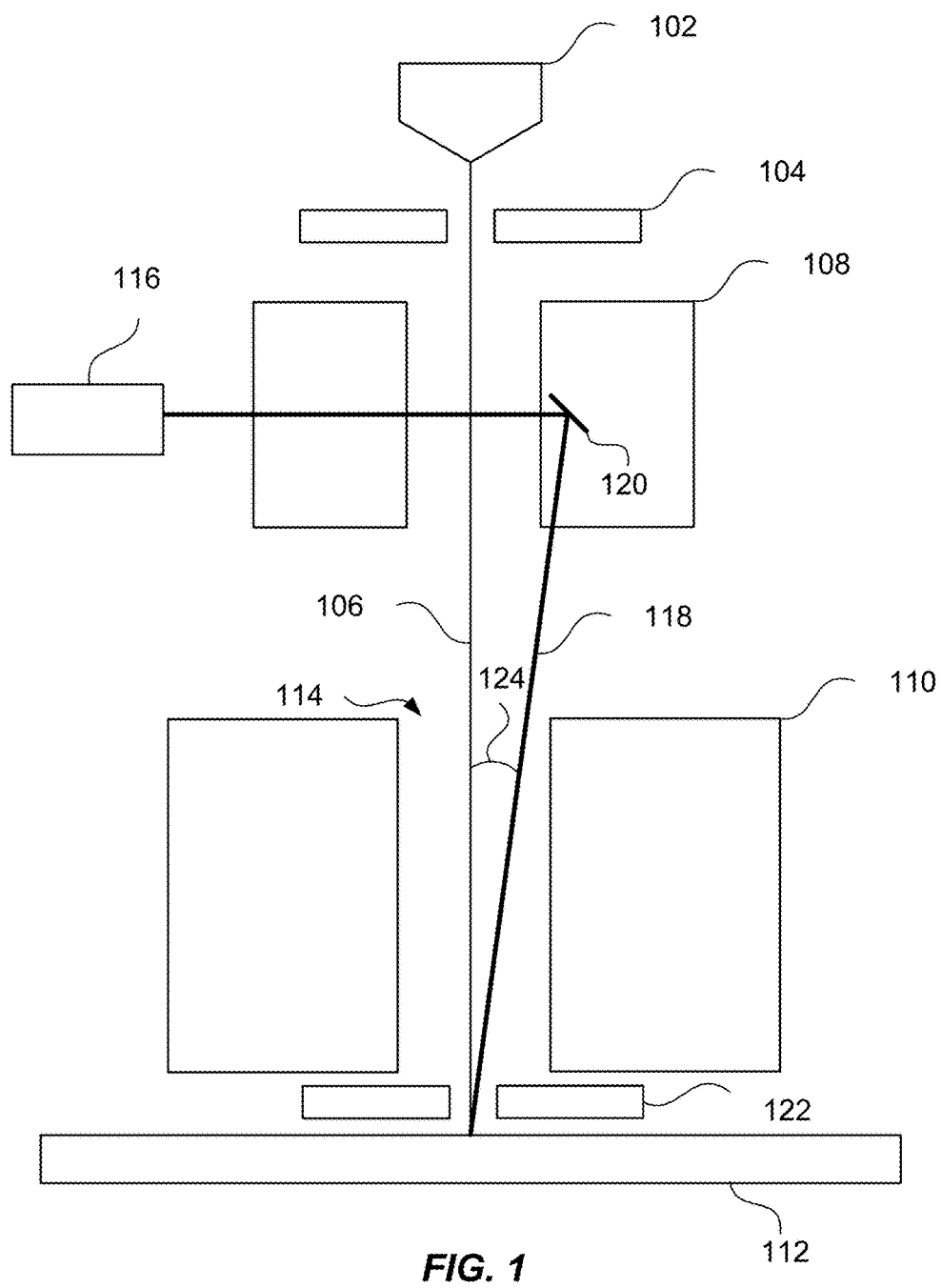
FIGS. 1-4 are simplified cross-sectional views of charged particle beam apparatuses in accordance with some embodiments.

FIG. 1 is a simplified cross-sectional view of a charged particle beam apparatus in accordance with an embodiment. In this example, a charged particle source 102 is provided that is configured to generate charged particles that are accelerated by an electrode 104 to form a charged particle beam 106. As an example, the source may generate electrons that are accelerated by the electrode 104 to generate an electron beam. The apparatus includes a bender unit 108 that is configured to adjust a path of the charged particle beam 106 using known deflection techniques. The bender unit 108 may use magnetic and/or electrostatic fields to adjust the path. The apparatus also includes an objective lens 110 that is configured to focus the charged particle beam 106 onto a spot on sample 112 using known focusing techniques. The objective lens 110 may use magnetic and/or electrostatic fields to focus the charged particle beam 106. The charged particle beam 106 passes through a bore 114 of the objective lens 110 as it propagates from the charged particle source 102 to the sample 112. The bender unit 108 and objective lens 110 align the charged particle beam 106 with the spot on the sample. Other alignment elements may be included in some embodiments in accordance with known techniques.

The apparatus also includes a detector 122 that is configured to detect charged particles emitted or reflected from the sample 112. The detector 122 is not limited to the configuration shown in this example and may be disposed in accordance with known techniques before the objective lens 110, within the objective lens 110, and/or after the objective lens 110. Some embodiments may include multi-detector configurations.

The apparatus also includes a light source 116 configured to generate a light beam 118. The light source 116 may be a light emitting diode or laser light source. A mirror 120 or other reflector disposed within the bender unit 108 is arranged to direct the light beam 118 to the spot on the sample 112. In some embodiments, the light beam 118 can be directed through the bore 114 of the objective lens 110 as it propagates from the mirror 120 to the sample 112. The light beam 118 can be used to control charging during particle beam inspection. This is particularly beneficial when scanning samples that include isolated conducting layers or non-conducting layers such as insulators that cannot otherwise dissipate charge buildup.

In some embodiments, a path of the light beam 118 can be adjusted to align the light beam 118 with the spot on the sample 112 by adjusting a pointing direction or orientation of the light source 116. In other embodiments, the mirror 120 may be adjustable to align the light beam 118 with the spot on the sample 112. As an example, the light source 116 and/or the mirror 120 may be mounted on an alignment stage that allows orientation adjustment in one or more axes. As another example, the mirror 120 may comprise one or more mechanical mirrors whose position can be altered to adjust the path of the light beam.

Adjusting the beam path can allow the light beam 118 to be aligned with the charged particle beam 106 on a surface of the sample 112 during scanning. The charged particle beam 106 can be scanned across the surface of the sample 112 using the bender unit 108 and/or other deflectors (not shown) using known scanning techniques, and the light beam 118 can be aligned with the charged particle beam 106 during scanning so that they both impinge on the sample 112 at the same spot.

The bender unit 108 may provide an unobstructed optical path for the light beam 118 as it passes through the bender unit 108. In an embodiment, the optical path includes one or more windows to isolate the light source 116 from a chamber of the charged particle beam apparatus without blocking the light beam. In some embodiments, the mirror may include multiple mirrors or reflectors that direct the light beam 118 from the light source 116 to the sample 112. Some of the mirrors or reflectors may be positioned outside the bender unit.

By positioning the mirror 120 in the bender unit 108, the light beam 118 can provide substantially on-axis illumination of the sample. In some embodiments, a path of the light beam 118 from the mirror 120 to the sample 112 may be substantially normal to a surface of the sample. As explained more fully below with regard to FIG. 5, this can increase light absorption and provide improved charged control during inspection. An angle 124 between the light beam 118 and the charged particle beam 106 can be 5° or less in some embodiments.

Figure 2:
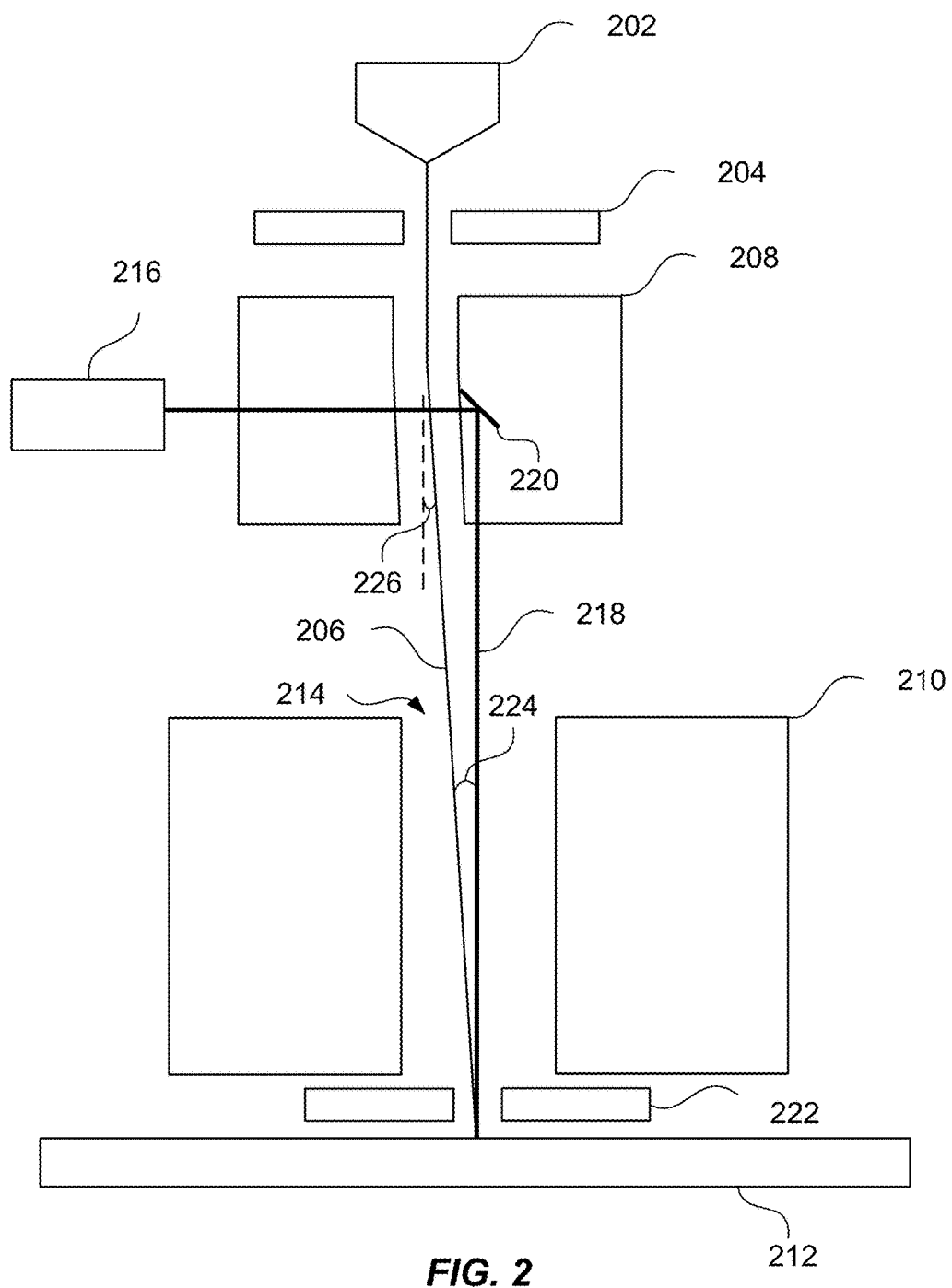

FIG. 2 is a simplified cross-sectional view of a charged particle beam apparatus in accordance with another embodiment. The apparatus in this example is similar to the one shown in FIG. 1 and includes a charged particle source 202 and electrode 204 for generating a charged particle beam 206. The apparatus also includes a bender unit 208 and objective lens 210 for directing the charged particle beam 206 to a spot on sample 212. The apparatus also includes a detector 222 for detecting charged particles emitted or reflected from the sample 212. The apparatus also includes a light source 216 for generating a light beam 218 and a mirror 220 or other reflector disposed within the bender unit 208 and arranged to direct the light beam 218 to the spot on the sample 212. The charged particle beam 206 and the light beam 218 pass through a bore 214 of the objective lens 210 as they propagate to the sample 212. Most of these components are similar to corresponding components shown and described with regard to FIG. 1 and may not be separately described in this section.

The example shown in FIG. 2 is different from the example shown in FIG. 1 in that the charged particle beam 206 is generated slightly off-axis with regard to an axis defined by the objective lens 210. A path of the charged particle beam 206 is adjusted by an angle 226 using the bender unit 208 and/or other alignment elements in accordance with known techniques so that the charged particle beam 206 is directed to the spot on the sample 212. Generating the charged particle beam 206 slightly off-axis allows the mirror 220 to be arranged so that the light beam 218 is substantially on-axis as it propagates to the spot on the sample 212. Alternatively, the charged particle beam 206 may be generated on-axis, and one or more bender units may adjust the path of the charged particle beam 206 off-axis to go around the mirror 220 and then back on-axis toward the spot on the sample. An angle 224 between the charged particle beam and the light beam is exaggerated in FIGS. 1-2 and may be about 5° or less in some embodiments.

Figure 3:
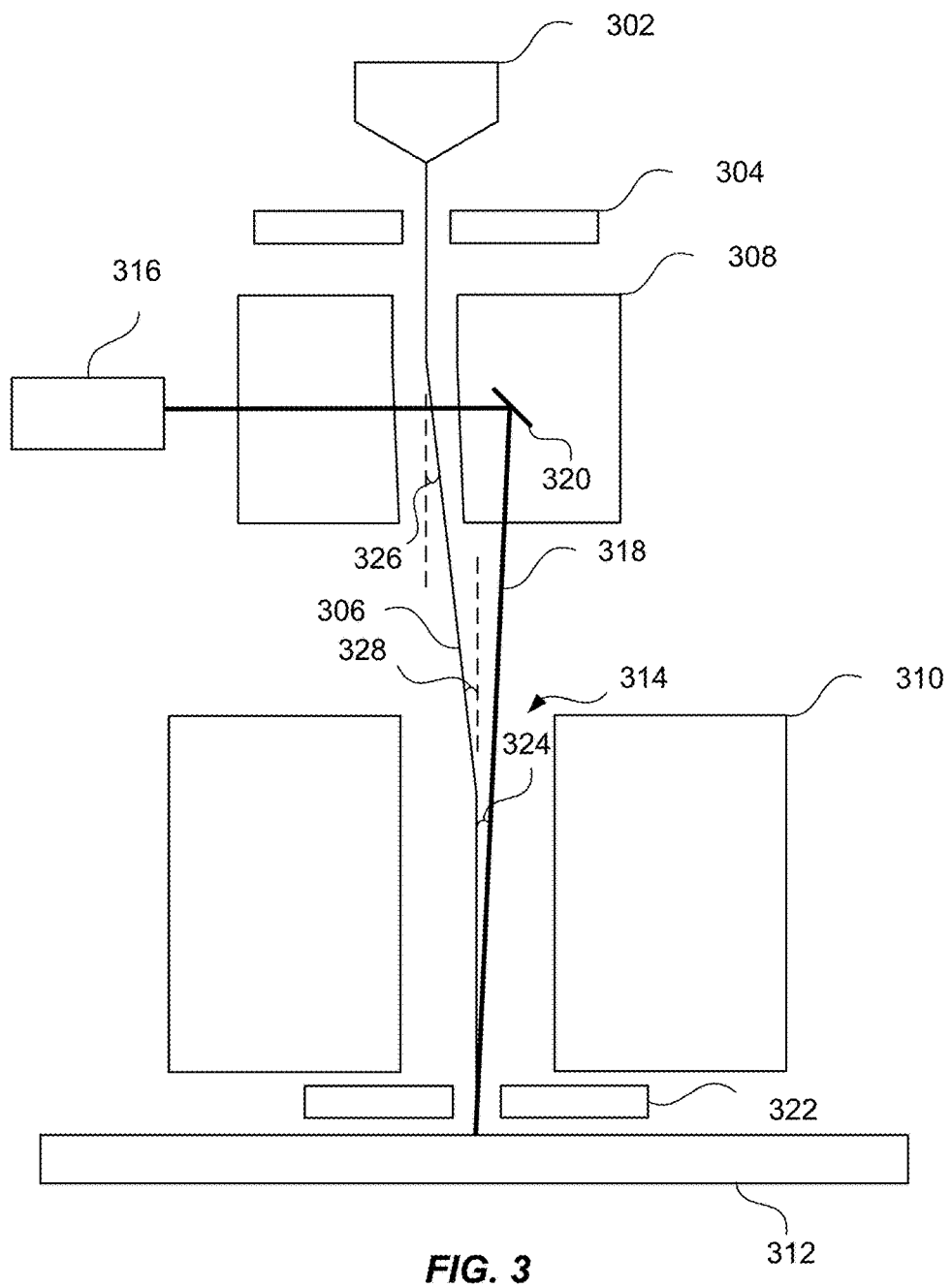

FIG. 3 is a simplified cross-sectional view of a charged particle beam apparatus in accordance with another embodiment. The apparatus in this example is similar to the ones shown in FIGS. 1-2 and includes a charged particle source 302 and electrode 304 for generating a charged particle beam 306. The apparatus also includes a bender unit 308 and objective lens 310 for directing the charged particle beam 306 to a spot on sample 312. The apparatus also includes a detector 322 for detecting charged particles emitted or reflected from the sample 312. The apparatus also includes a light source 316 for generating a light beam 318 and a mirror 320 or other reflector disposed within the bender unit 308 and arranged to direct the light beam 318 to the spot on the sample 312. The charged particle beam 306 and the light beam 318 pass through a bore 314 of the objective lens 310 as they propagate to the sample 312. Most of these components are similar to corresponding components shown and described with regard to FIG. 1 and may not be separately described in this section.

The example shown in FIG. 3 is different from the examples shown in FIGS. 1-2 in that a path of the charged particle beam 306 is adjusted by a first angle 326 and a second angle 328 using the bender unit 308, the objective lens 310, and/or other alignment elements. In this example, the charged particle beam 306 impinges on the sample at a substantially normal incidence. This arrangement allows the charged particle beam 306 and the light beam 318 to be separated by an angle 324 of 5° or less so that both are directed to the sample 312 at a substantially normal incidence.

Figure 4:
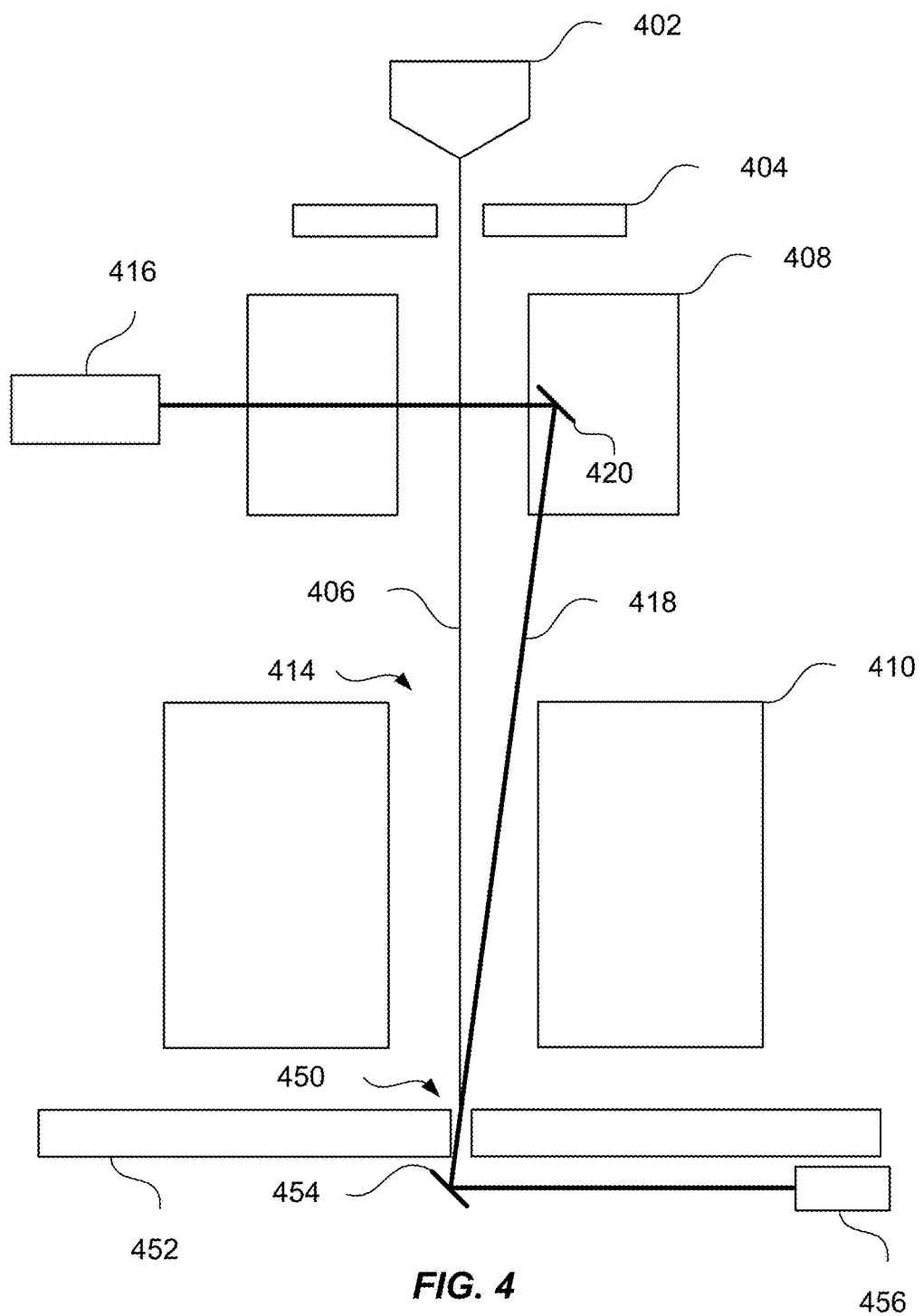

FIG. 4 is a simplified cross-sectional view of a charged particle beam apparatus in accordance with another embodiment. The apparatus in this example is similar to the one shown in FIGS. 1-3 and includes a charged particle source 402 and electrode 404 for generating a charged particle beam 406. The apparatus also includes a bender unit 408 and objective lens 410 for directing the charged particle beam 406 toward a sample support 452. The apparatus also includes a light source 416 for generating a light beam 418 and a mirror 420 or other reflector disposed within the bender unit 408 and arranged to direct the light beam 418 toward the sample support 452. Most of these components are similar to corresponding components shown and described with regard to FIG. 1 and may not be separately described in this section.

The example shown in FIG. 4 is different from the example shown in FIG. 1 in that the sample support 452 is shown rather than a sample. It should be appreciated that the samples 112, 212, 312 shown in FIGS. 1-3 are supported by a sample support even though the sample support is not explicitly shown. Similarly, it should be appreciated that the example of FIG. 4 includes one or more detectors even though the detectors are not explicitly shown.

In some embodiments, the sample support 452 includes a pinhole 450 extending through a central region and a mirror 454 or other reflector arranged to direct light passing through the pinhole 450 to a light sensor 456. The light sensor 456 may be disposed on an opposite side of the sample support 452 from the objective lens 410. These features can be used to align the charged particle beam 406 and light beam 418 at a particular spot on the sample.

To align the beams, the charged particle beam 406 is scanned across a surface of the sample support 452. Charged particles emitted or reflected from the sample support 452 are detected to identify the pinhole 450 in the sample support 452. A path of the charged particle beam 406 is adjusted (if necessary) to be substantially aligned with the pinhole 450.

The light sensor 456 is used to detect light when the light beam 418 is aligned with the pinhole 450. A path of the light beam 418 is adjusted (if necessary) to be substantially aligned with the pinhole. After aligning the charged particle beam 406 and the light beam 418 with the pinhole 450, a sample may be loaded on the sample support 452 and inspected in accordance with the inspection processes described herein.

It should be appreciated that not all embodiments include a sample support with these features, and some embodiments include a solid sample support that does not include a pinhole. For embodiments that include a pinhole, a diameter and shape of the pinhole may be selected based on a desired precision in alignment between the charged particle beam and the light beam.

Figure 5:
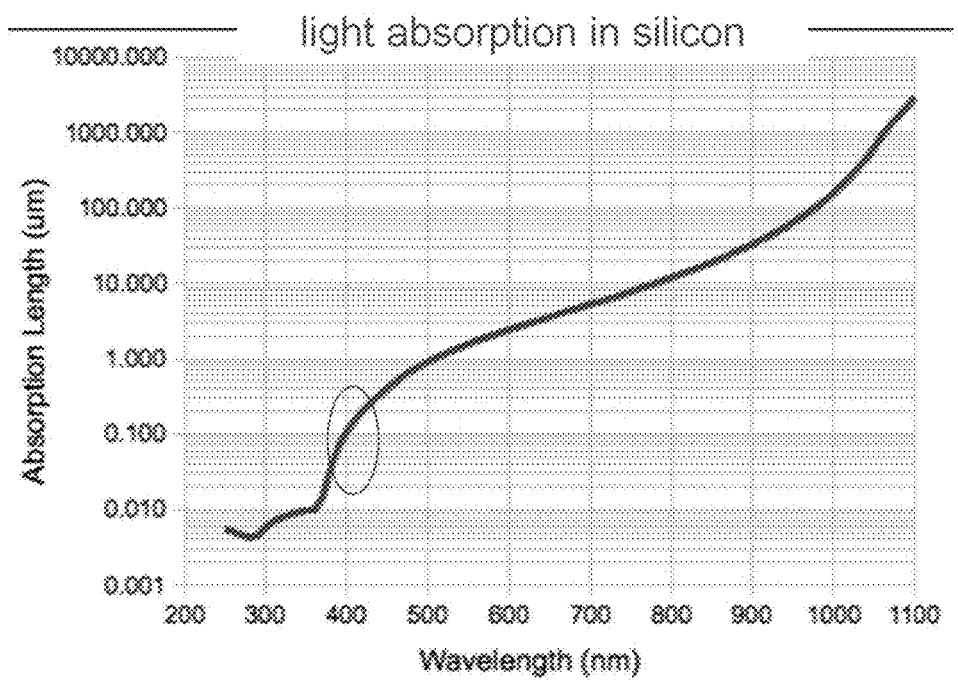
FIG. 5 is a plot of light absorption in silicon.

FIG. 5 is a plot of light absorption in silicon. Some samples may include semiconductor devices or layers that form p-n junctions or other structures that can be electrically turned on or made conductive. Depending on the type and depth of the structure, the wavelength of light provided by the light beam can be selected to facilitate dissipation of charge that may otherwise buildup on the sample and/or to activate or turn on devices such as diodes within the sample. The wavelength may be selected to penetrate outer layers and be absorbed at the p-n junction or at other layers that can facilitate charge dissipation and/or charge conduction. This improves charge control during inspection. Using FIG. 5 as an example, light with a wavelength of about 400 nm has a broad absorption length in silicon and can provide improved charge control in some samples compared to light at other wavelengths.

In some embodiments, a polarization of the light beam can be selected based on a structure on the sample to improve light penetration into the sample. For example, the polarization of the light beam can be selected to be substantially perpendicular to lines on the sample to improve penetration compared to polarization that is substantially parallel to the lines.

Figure 6:
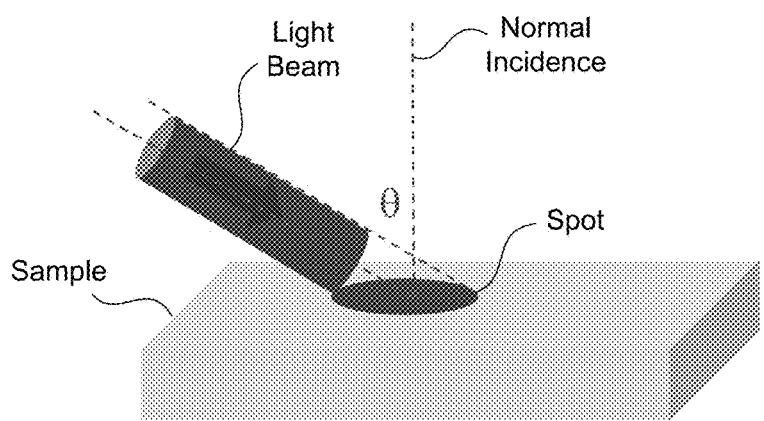
FIG. 6 is a simplified diagram illustrating a relationship between illumination angle and spot size.

FIG. 6 is a simplified diagram illustrating a relationship between illumination angle and spot size. The light beam in this example strikes the sample at a large illumination angle (or angle of incidence). The large illumination angle increases the spot size on a surface of the sample by $$\frac{1}{\cos(\theta)}.$$

As the spot size increases, the light is spread out over a larger area and radiant flux decreases by $\cos(\theta)$. On the other hand, as the illumination angle approaches normal incidence (zero illumination angle), the radiant flux approaches a maximum. This can improve charge control. Some embodiments described herein allow the light beam to be directed to the sample at a substantially normal incidence, thus improving absorption and consequently charge control for a given light beam.

Figure 7:
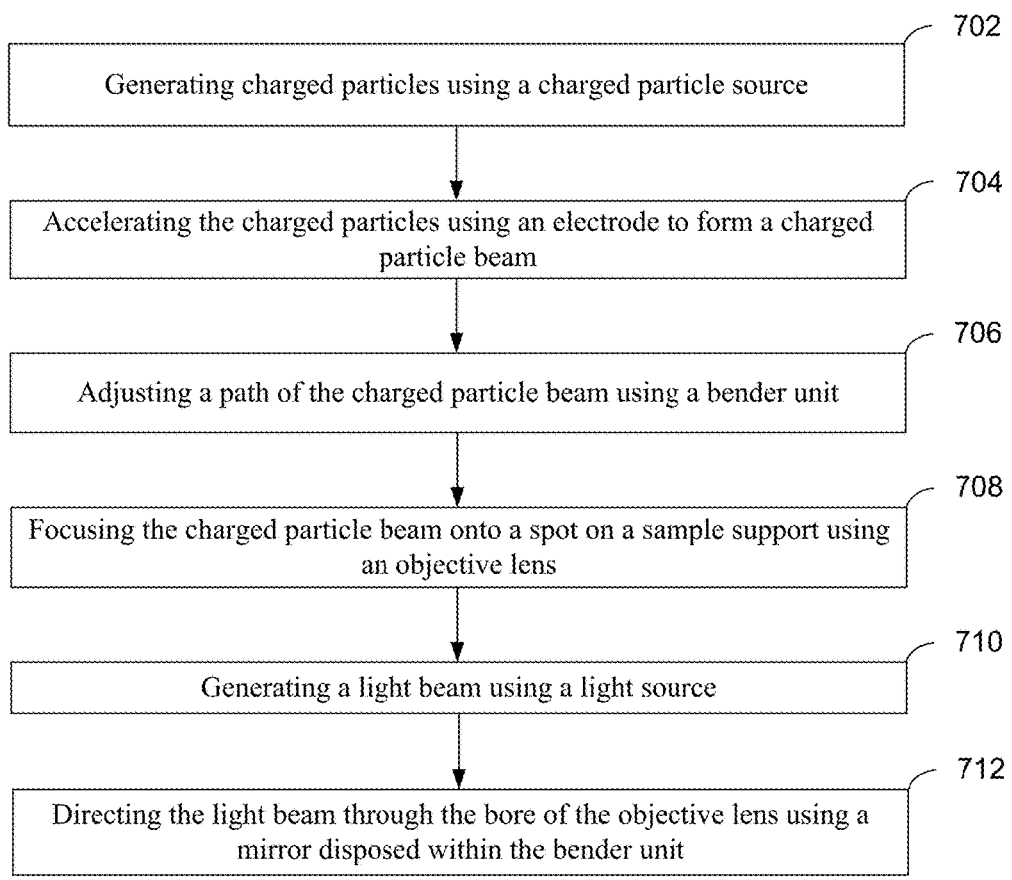
FIG. 7 is a flowchart that outlines a method of scanning a sample in accordance with an embodiment.

FIG. 7 is a flowchart that outlines a method of scanning a sample in accordance with an embodiment. The method includes generating charged particles using a charged particle source (702), accelerating the charged particles using an electrode to form a charged particle beam (704), adjusting a path of the charged particle beam using a bender unit (706), and focusing the charged particle beam onto a spot on the sample using an objective lens (708). The charged particle beam passes through a bore of the objective lens as the charged particle beam propagates from the charged particle source to the sample.

The method also includes generating a light beam using a light source (710), and directing the light beam through a bore of the objective lens using a mirror disposed within the bender unit (712). The light beam may be directed to the spot on the sample by adjusting a pointing direction of the light source or by adjusting a position of the mirror. Adjusting the position may include adjusting a location and/or an orientation of the mirror.

In some embodiments, the path of the charged particle beam may be adjusted to scan a surface of the sample, and the light beam may be aligned with the charged particle beam on the surface of the sample during scanning.

Figure 8:
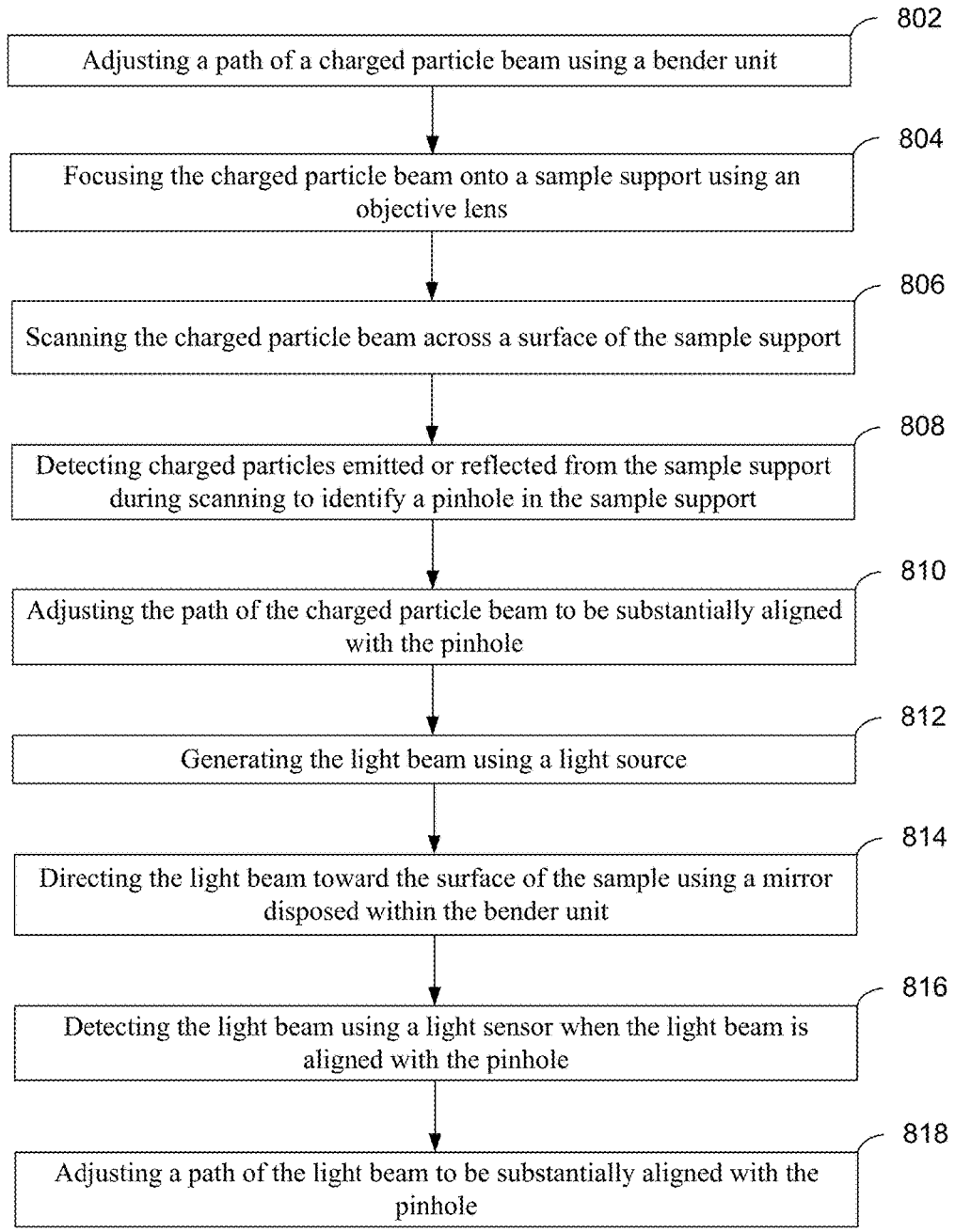
FIG. 8 is a flowchart that outlines a method of aligning a charged particle beam with a light beam in accordance with an embodiment.

FIG. 8 is a flowchart that outlines a method of aligning a charged particle beam with a light beam in accordance with an embodiment. The method includes adjusting a path of a charged particle beam using a bender unit (802), focusing the charged particle beam onto a sample support using an objective lens (804), and scanning the charged particle beam across a surface of the sample support (806). Charged particles emitted or reflected from the sample support are detected during scanning to identify a pinhole in the sample support (808). A path of the charged particle beam is adjusted to be substantially aligned with the pinhole (810).

The method also includes generating a light beam using a light source (812) and directing the light beam toward the surface of the sample using a mirror disposed within the bender unit (814). The light beam is detected using a light sensor when the light beam is aligned with the pinhole (816). A path of the light beam is adjusted to be substantially aligned with the pinhole (818).

In some embodiments, the mirror is arranged to direct the light beam through the bore of the objective lens and to the surface of the sample.

It should be appreciated that the specific steps illustrated in FIGS. 7-8 provide particular methods according to some embodiments. Other sequences of steps may also be performed according to alternative embodiments. For example, alternative embodiments may perform the steps outlined above in a different order. Moreover, the individual steps illustrated in FIGS. 7-8 may include multiple sub-steps that may be performed in various sequences. Furthermore, additional steps may be added or removed depending on the particular application.

While the foregoing is directed to specific embodiments, other and further embodiments may be devised without departing from the basic scope thereof, and the scope thereof is determined by the claims that follow.

What is claimed is:

1. A charged particle beam apparatus, comprising:
a charged particle source configured to generate charged particles;
an electrode configured to accelerate the charged particles to form a charged particle beam;
a bender unit configured to adjust a path of the charged particle beam;
an objective lens configured to focus the charged particle beam onto a spot on a sample, the charged particle beam passing through a bore of the objective lens as the charged particle beam propagates from the charged particle source to the sample;
a light source configured to generate a light beam;
a mirror disposed within the bender unit and arranged to direct the light beam to the spot on the sample;
a sample support configured to support the sample, the sample support having a pinhole extending through a central region; and
a light sensor disposed on an opposite side of the sample support from the objective lens, the light sensor configured to sense light when the light beam is aligned with the pinhole.

2. The apparatus of claim 1 wherein a pointing direction of the light source is adjustable to align the light beam with the spot on the sample.

3. The apparatus of claim 1 wherein a position of the mirror is adjustable to align the light beam with the spot on the sample.

4. The apparatus of claim 1 wherein the path of the charged particle beam is adjustable to scan the charged particle beam on a surface of the sample, and the light source is adjustable to align the light beam with the charged particle beam on the surface of the sample during scanning.

5. The apparatus of claim 1 wherein an axis of the charged particle beam and an axis of the light beam are separated by an angle of less than 3° to provide substantially on-axis illumination of the spot.

6. The apparatus of claim 1 wherein the mirror is arranged to direct the light beam through the bore of the objective lens and to the spot on the sample.

7. The apparatus of claim 1 wherein the bender unit comprises an unobstructed path that does not block the light beam as the light beam passes through the bender unit.

8. The apparatus of claim 1 further comprising a detector configured to detect charged particles emitted or reflected from the sample.

9. The apparatus of claim 1 wherein a path of the light beam from the mirror to the spot on the sample is substantially normal to a surface of the sample.

10. A method of scanning a sample, the method comprising:
generating charged particles using a charged particle source;
accelerating the charged particles using an electrode to form a charged particle beam;
adjusting a path of the charged particle beam using a bender unit;
focusing the charged particle beam onto a spot on the sample using an objective lens, the charged particle beam passing through a bore of the objective lens as the charged particle beam propagates from the charged particle source to the sample;
generating a light beam using a light source;
directing the light beam through the bore of the objective lens using a mirror disposed within the bender unit, the light beam directed to the spot on the sample; and
adjusting a position of the mirror to align the light beam with the spot on the sample.

11. The method of claim 10 further comprising adjusting a pointing direction of the light source to align the light beam with the spot on the sample.

12. The method of claim 10 further comprising:
adjusting the path of the charged particle beam to scan the charged particle beam on a surface of the sample; and
adjusting an orientation of the light source to align the light beam with the charged particle beam on the surface of the sample during scanning.

13. A method of aligning a charged particle beam of a charged particle apparatus with a light beam, the method comprising:
generating charged particles using a charged particle source;
accelerating the charged particles using an electrode to form the charged particle beam;
adjusting a path of the charged particle beam using a bender unit;
focusing the charged particle beam onto a sample support using an objective lens, the charged particle beam passing through a bore of the objective lens as the charged particle beam propagates from the charged particle source to the sample support;
scanning the charged particle beam across a surface of the sample support;
detecting charged particles emitted or reflected from the sample support during scanning to identify a pinhole in the sample support;
adjusting the path of the charged particle beam to be substantially aligned with the pinhole;
generating the light beam using a light source;
directing the light beam toward the surface of the sample using a mirror disposed within the bender unit;
detecting the light beam using a light sensor when the light beam is aligned with the pinhole; and
adjusting a path of the light beam to be substantially aligned with the pinhole.

14. The method of claim 13 further comprising:
loading a sample onto the sample support;
scanning a surface of the sample with the charged particle beam; and
adjusting the path of the light beam to align the light beam with the charged particle beam on the surface of the sample during scanning.

15. The method of claim 13 wherein the path of the light beam is adjusted by changing a pointing direction of the light source.

16. The method of claim 13 wherein the path of the light beam is adjusted by changing a position of the mirror.

17. The method of claim 13 wherein the charged particle beam and the light beam are separated by an angle of less than 2° when both are aligned with the pinhole.

18. The method of claim 13 wherein the mirror is arranged to direct the light beam through the bore of the objective lens and to the surface of the sample.

* * * * *